(12) United States Patent
Sato (10) Patent No.: US 9,148,226 B2
(45) Date of Patent: Sep. 29, 2015

(54) OPTICAL MODULE AND OPTICAL TRANSCEIVER INSTALLING THE SAME

(71) Applicant: Sumitomo Electric Industries, Ltd., Osaka-shi (JP)

(72) Inventor: Shunsuke Sato, Yokohama (JP)

(73) Assignee: Sumitomo Electric Industries, Ltd, Osaka-shi (JP)

( * ) Notice: Subject to any disclaimer, the term of this patent is extended or adjusted under 35 U.S.C. 154(b) by 0 days.

(21) Appl. No.: 14/057,929

(22) Filed: Oct. 18, 2013

(65) Prior Publication Data

US 2014/0126917 A1   May 8, 2014

(30) Foreign Application Priority Data

Nov. 8, 2012   (JP) .................................. 2012-245958

(51) Int. Cl.
| | |
|---|---|
| H01S 5/024 | (2006.01) |
| H04B 10/40 | (2013.01) |
| G02B 6/42 | (2006.01) |
| H01L 23/38 | (2006.01) |
| H01S 5/022 | (2006.01) |
| H01S 5/16 | (2006.01) |
| H01S 5/40 | (2006.01) |

(52) U.S. Cl.
CPC .............. *H04B 10/40* (2013.01); *G02B 6/4257* (2013.01); *G02B 6/4265* (2013.01); *G02B 6/4271* (2013.01); *H01L 23/38* (2013.01); *H01S 5/022* (2013.01); *H01S 5/02208* (2013.01); *H01S 5/02248* (2013.01); *H01S 5/02415* (2013.01); *H01S 5/16* (2013.01); *H01S 5/4012* (2013.01)

(58) Field of Classification Search
CPC . H01S 5/02415; H01S 5/022; H01S 5/02216; H01S 5/02208; H01S 5/02248; H01S 5/4012; H01L 23/38
USPC ............. 372/34, 36; 257/98, 99, 720; 438/25, 438/26, 27, 29, 121, 122; 398/182
See application file for complete search history.

(56) References Cited

U.S. PATENT DOCUMENTS

| | | | |
|---|---|---|---|
| 5,515,391 A * | 5/1996 | Endriz | ............................. 372/34 |
| 6,821,030 B2 | 11/2004 | Fukuda et al. | |
| 7,106,978 B2 | 9/2006 | Nasu et al. | |
| 8,213,472 B2 | 7/2012 | Hirai et al. | |
| 2003/0214031 A1 * | 11/2003 | Onoue | ........................... 257/734 |
| 2011/0069968 A1 * | 3/2011 | Tanaka | .......................... 398/140 |

* cited by examiner

*Primary Examiner* — Yuanda Zhang
*Assistant Examiner* — Michael Carter
(74) *Attorney, Agent, or Firm* — Venable LLP; Michael A. Sartori; Trent B. Ostler (57) ABSTRACT

An optical transmitter module installing a thermo-electric controller (TEC) is disclosed. The optical module has a rectangular box portion as a package made of a multi-layered ceramics, within which the TEC is installed. The TEC has electrodes through which a current to driver the TEC electrically is provided. The module has a feature that the electrodes of the TEC is directly in contact with a pad provided in the back surface of the multi-layered ceramic housing.

8 Claims, 11 Drawing Sheets

OPTICAL MODULE AND OPTICAL TRANSCEIVER INSTALLING THE SAME

BACKGROUND

1. Field

The present application relates to a transmitter optical module, in particular, the application relates to a transmitter optical module that installs a plurality of semiconductor laser diodes (hereafter denoted as LD), a thermo-electric controller (hereafter denoted as TEC), and a wiring mechanism to the TEC within a housing of the transmitter optical module.

2. Description of the Related Art

A transmitter optical module is often used as an optical signal source of an optical transceiver and/or an optical pumping source for a fiber amplifier. A transmitter optical module generally installs therein an LD to transduce an electrical signal into an optical signal with an emission wavelength depending on a temperature of the LD. In order to keep the emission wavelength in constant in a preset wavelength, the transmitter optical module provides a TEC to control a temperature of the LD.

Various techniques have been known in the field to provide electrical currents from the outside of an housing to the TEC set in a bottom of the housing. The current to be supplied to the TEC sometimes becomes large, occasionally exceeding a several amperes. In order to provide such a large current securely, a particular arrangement for the electrical connection to the TEC is necessary. For instance, a wire with an extremely large cross section, and/or, an interconnection having extremely wide and thick dimensions on a wiring substrate has been conventionally known. The present application is to provide another technique to supply a large current to the TEC within the housing.

SUMMARY

An transmitter optical module according to one of the embodiments of the present application provides an optical transmitting device, which is typically an LD, to emit light with a specific wavelength, a TEC to control a temperature of the LD, and a box portion that encloses the LD and the TEC therein. The box portion is made of a multi-layered ceramics including ceramic layers, where one of the ceramic layers provides an electrical pad to supply a current to drive the TEC. A feature of the embodiment of the application is that the TEC provides a pillar facing the electrical pad of the ceramic layer, and being directly connected to the pad by, for instance, a solder without using any bonding wires.

BRIEF DESCRIPTION OF THE DRAWINGS

The foregoing and other purposes, aspects and advantages will be better understood from the following detailed description of embodiments with reference to the drawings, in which.

DETAILED DESCRIPTION

Figure 1:
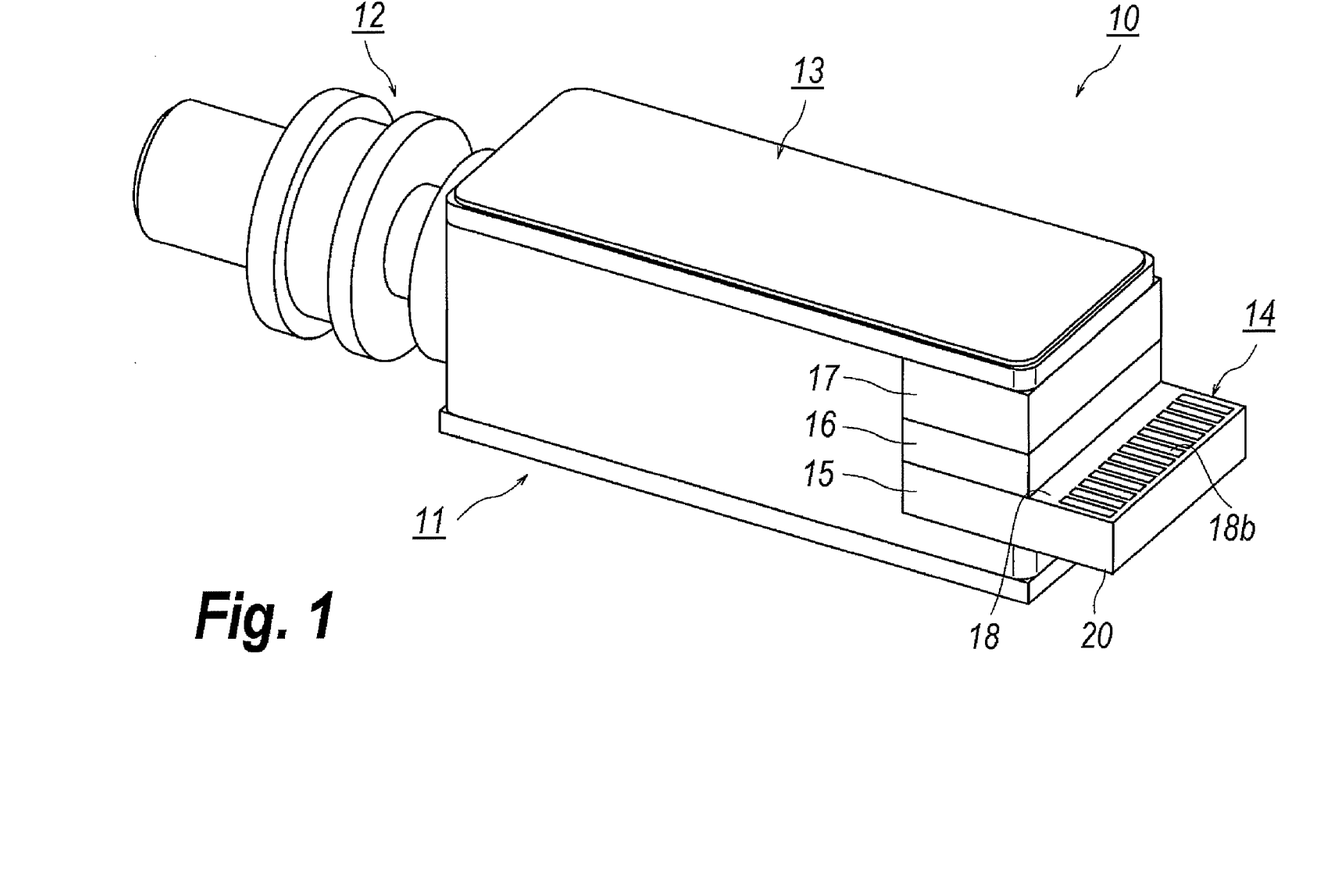
FIG. 1 shows an outer appearance of an optical transmitter module according to an embodiment.
Figure 2:
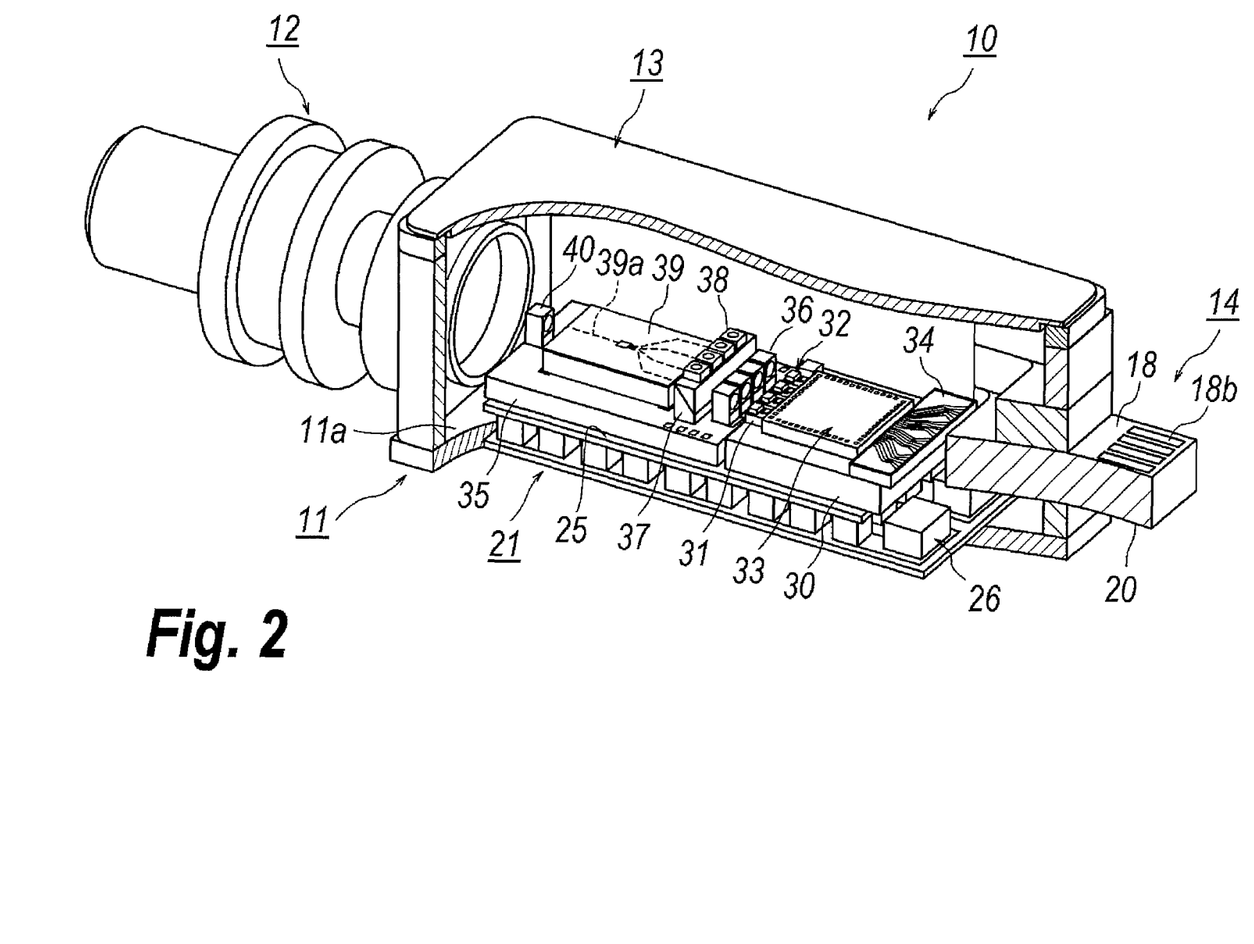
FIG. 2 is a perspective view of the optical transmitter module, where a portion of a box portion is removed to show an inside of the module.

Some embodiments will be described as referring to drawings. FIG. 1 shows an outer appearance of an optical module of an embodiment and FIG. 2 is a view where a housing of the optical module is partially cut away to show the inside thereof. The optical module of the present embodiment is a type of, what is called, transmitter optical module installing one or more LDs therein. Such an optical module is used in the wavelength division multiplexing (WDM) system as an optical signal source.

The optical module 10 includes a box portion 11 with a rectangular shape, an optical coupling portion 12 with a cylindrical shape, and a lid 13 to form a cavity within which optical and electrical devices are hermetically enclosed. The box portion 11, as shown in FIG. 2, installs therein a TEC 21 on which first and second carriers, 30 and 35, are placed. The first carrier 30 mounts electronic components thereon, such as an IC 33, a wiring substrate 34, and LDs 32 through an LD carriers or LD sub-mounts 31; while, the second carrier 35 mounts optical components thereon, for instance, concentrating lenses 36, monitor photodiodes (hereafter denoted as PD) 38, an optical multiplexer 39, and a collimating lens 40. The coupling portion 12 encloses a concentrating lens to focus light coming from the collimating lens 40 onto a tip of an external fiber.

The optical module 10 of the embodiment installs a plurality of LDs 32 therein, where the embodiment shown in figures has four (4) LDs, each emits light having a specific emission wavelength different from others, for instance, following the standard of the LAN-WDM, namely, one standard ruling widely spaced DWDM grid for LAN applications with a span to the neighbor grid around 5 nm. Optical beams coming from respective LDs 32 are combined by the optical multiplexer 39, collimated by the collimating lens 40 and then concentrated by the concentrating lens enclosed in the coupling portion 12 onto a single fiber coupled with the coupling portion 12. Thus, the wavelength multiplexed optical module 10 enhances the capacity of signals to be transmitted within the single optical fiber.

The box portion 11, which has a rectangular shape, provides the coupling portion 12 in one side thereof. The coupling portion 12 receives an external optical connector not shown in figures and optically couples an external fiber in the optical connector with the LDs 32 in the box portion 11. The box portion 11 further provides an electrical plug 14 in a rear end opposite to the side above described. The rear side of the box portion 11 is formed by multi-layered ceramics including the first to third layers, 15 to 17.

Figure 8:
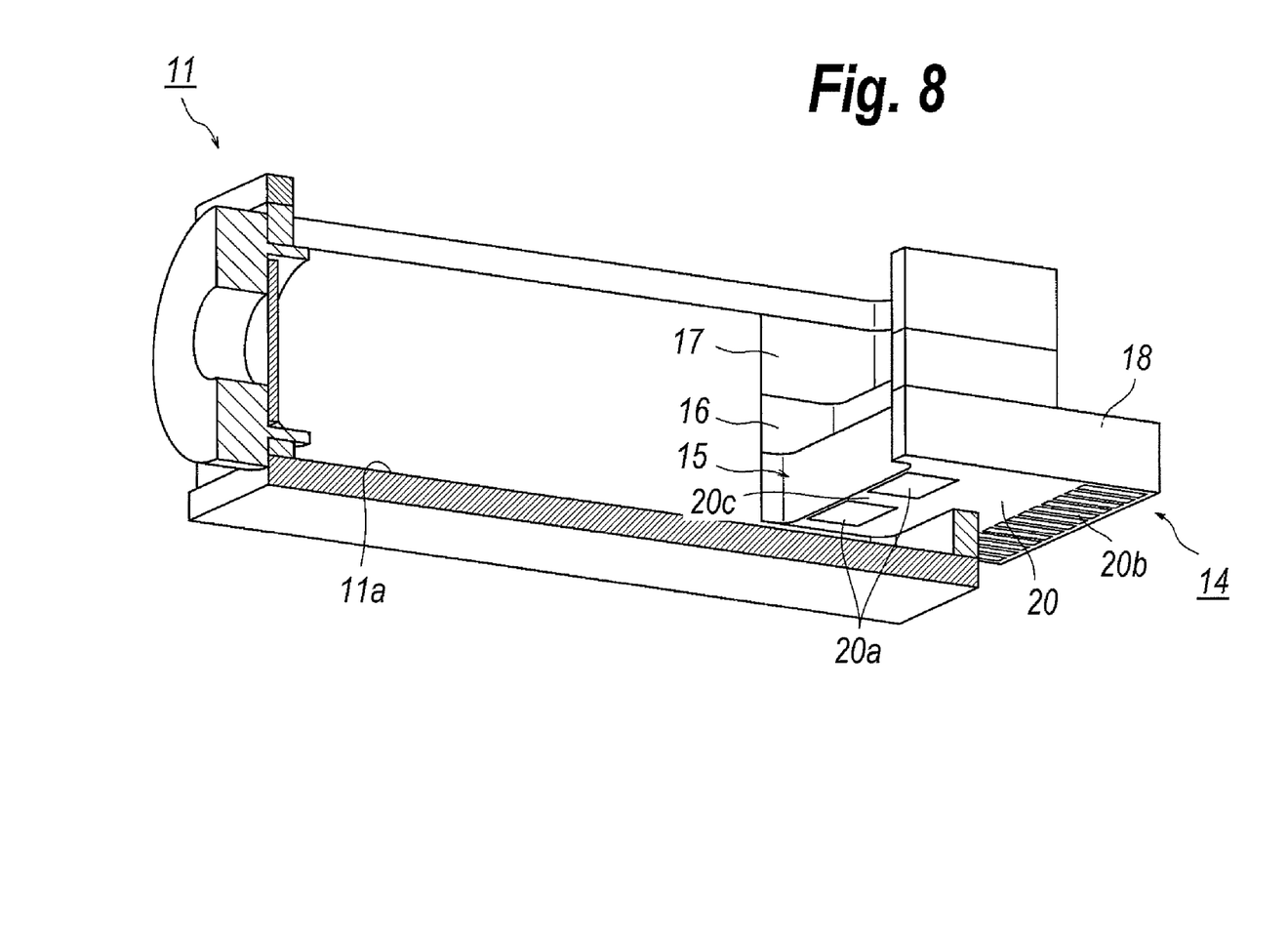
FIG. 8 shows a partial cross section of the box portion shown in FIG. 7.

The first layer 15 includes a top surface 18 and a back surface 20 in a portion protruding externally from the box portion 11. The top surface 18 provides a plurality of electrodes 18b, while, the back surface provides other electrodes 20b, as shown in FIG. 8. These electrodes, 18b and 20b, are electrically connected to the host system outside of the optical module 10 by, for instance, a flexible printed circuit (FPC) board.

Figure 3:
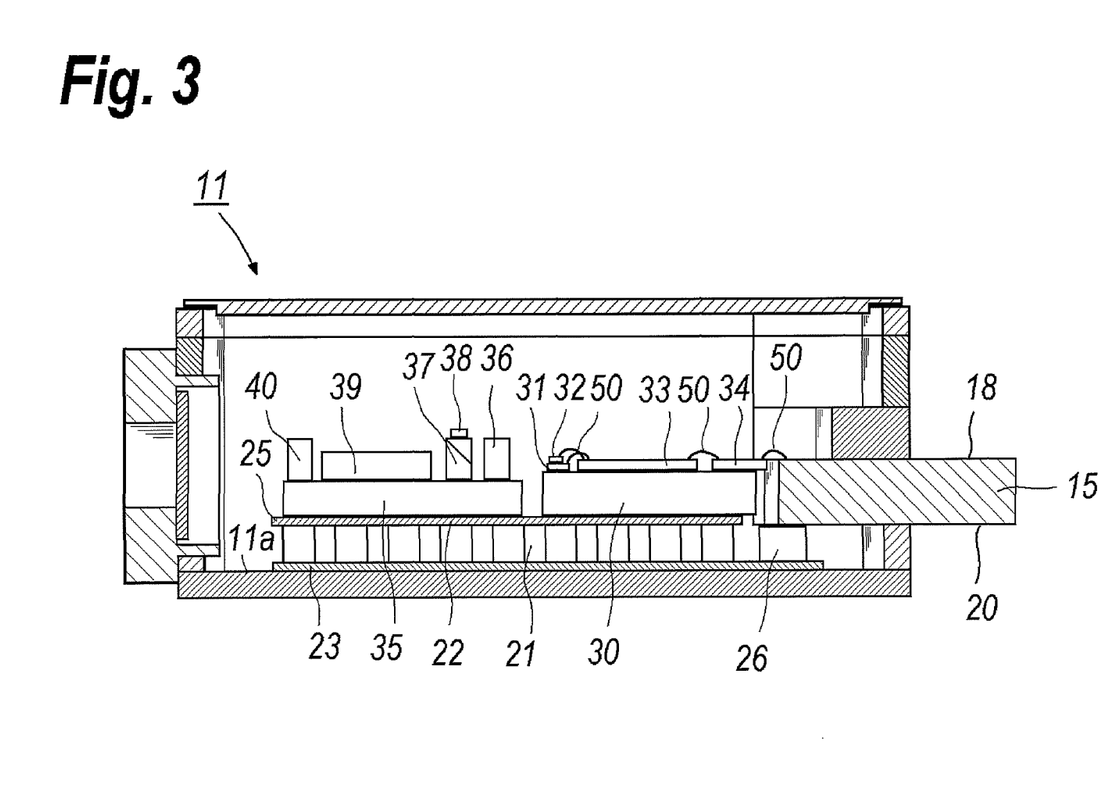
FIG. 3 shows a side cross section of the box portion of the optical transmitter module shown in FIG. 1.

The box portion 11 installs the TEC 21 therein. FIG. 3 shows a side cross section of the box portion 11. As already described, the first and second carriers, 30 and 35, are mounted on the top surface 25 of TEC 21, and each of carriers, 30 and 35, are preferably made of aluminum nitride (AlN). The first carrier 30 mounts thereon the IC 33 and the LDs 32 through the LD sub-mounts 31, where the LD sub-mounts 31 are also made of AlN. The first carrier 30 also mounts thereon the wiring substrate 34 to connect the electrodes 18b on the top surface of the first ceramic layer 15 electrically to the IC 33. The optical module 10 is operable in frequencies exceeding 10 Gbps, sometimes reaching 25 Gbps. In order to carry such high frequency signals, a condition to match the transmission impedance is necessary, and the wiring substrate 34 of the embodiment provides a plurality of interconnections with an arrangement of the micro-strip line and/or the co-planar line whose transmission impedance is secured.

The wiring substrate 34 also enables to shorten lengths of bonding wires connecting the electrodes 18b on the first ceramic layer 15 to the interconnections on the wiring substrate 34, and those connecting the interconnections on the wiring substrate 34 to electrical pads formed on the IC 33. Moreover, as shown in FIG. 3, the top level of the top surface 18 of the first ceramic layer 15, that of the wiring substrate 34, and that of the IC 33 are evened, which also shortens the length of the boding wires.

The TEC 21, which is usually installed within an optical module applied to the WDM communication system, controls the emission wavelength of an LD precisely. An LD generally and inherently shows large temperature dependence in the emission wavelength and the emission efficiency thereof. Accordingly, when an LD is used in a system where the signal wavelength is severely and precisely controlled, such as the dense wavelength division multiplexing (DWDM) system and the LAN-WDM system for the present optical module, a means to control the temperature of an LD is inevitable. The TEC 21 is mounted on the bottom of the box portion 11 and controls a temperature not only the LDs 32 but the optical multiplexer 39 mounted on the second carrier 35.

The first and second carriers, 30 and 35, are arranged along the longitudinal direction of the box portion 11, which is substantially in parallel to the optical axis of the coupling portion 12. The LDs 32 and the LD sub-mounts 31 are arranged along the lateral direction of the box portion 11 intersecting the optical axis described above. The embodiments shown in the figures provide a plurality of LD sub-mounts corresponding to respective LDs 32. However, the optical module 10 may provide one LD sub-mount 31 on which all LDs are mounted.

Although not explicitly shown in the figures, the TEC 21 mounts a temperature sensor, for instance, a thermistor, on the first carrier 30 and/or the second carrier 35 to sense the temperature of the LDs 32, or that of the optical multiplexer 39. In an alternate, the IC 33 may be built to have a temperature sensor therein. The output of such a temperature sensor is fed back to a driver to drive the TEC 21.

The IC 33 installs therein a plurality of LD drivers driving respective LDs 32 independently. Also, the IC 33 preferably installs therein an automatic power controlling (APC) circuit for keeping average optical power output from respective LDs 32. The optical output of the LD is monitored by the monitor PD 38 and the output of the monitor PD 38 is fed back to the APC in the IC 33. The embodiment builds the APC circuit integrally within the IC 33. However, the APC circuit may be prepared in a circuit placed out of the optical module 10.

The LDs 32, which are mounted on the respective LD sub-mounts 31, are electrically connected to the IC 33 with bonding wires. The LDs have, what is called, the edge emitting type to emit light from a cleaved facet toward the concentrating lens 36.

The second carrier 35 mounts the concentrating lenses 36 arranged in an array along the lateral direction of the box portion 11. The concentrating lenses 36 concentrate the light emitted by the LDs 32. The second carrier 35 also mounts the optical multiplexer 39 and the collimating lens 40 thereon. The optical multiplexer 39 multiplexes the light coming from the concentrating lenses 36 into one beam and guides thus multiplexed optical beam on a waveguide 39a. The collimating lens 40 collimates the multiplexed beam onto the external fiber set in the coupling portion 12.

The second carrier 35 further mounts thereon monitor PDs 38 through a beam splitter 37 between the optical multiplexer 39 and the concentrating lenses 36. The beam splitter 37, which assembles two prisms, passes a portion of light coming from the concentrating lenses 36 and reflects rest portion of the light toward monitor PDs 38. A ratio of the rest portion of the light is 1 to 10% of the light input to the beam splitter 37. The monitor PDs 38 are also arranged in array along the lateral direction of the box portion 11 and converts the rest portion of the light into electrical signals. The LDs 32 are controlled in an average output power thereof based on the electrical signals output from the monitor PDs 38. Although not explicitly shown in figures, the second carrier 35 may mount an optical isolator thereon to prevent backward light reflected by interfaces between media set on the optical axes of the LDs 32 from returning the LDs 32.

Specifically, the electrical signal output from the monitor PD 38 is brought to the APC circuit set outside of the box portion 11, or built in the IC 33. The APC circuit operates the LD driver built in the IC 33 such that the magnitude of the electrical signal is kept in substantially constant in a reference level. The LD driver adjusts the driving current of the LD 32, namely, the bias current and/or the modulation current. Thus, the LD 32 in the average output power thereof is controlled by the APC circuit.

Figure 4:
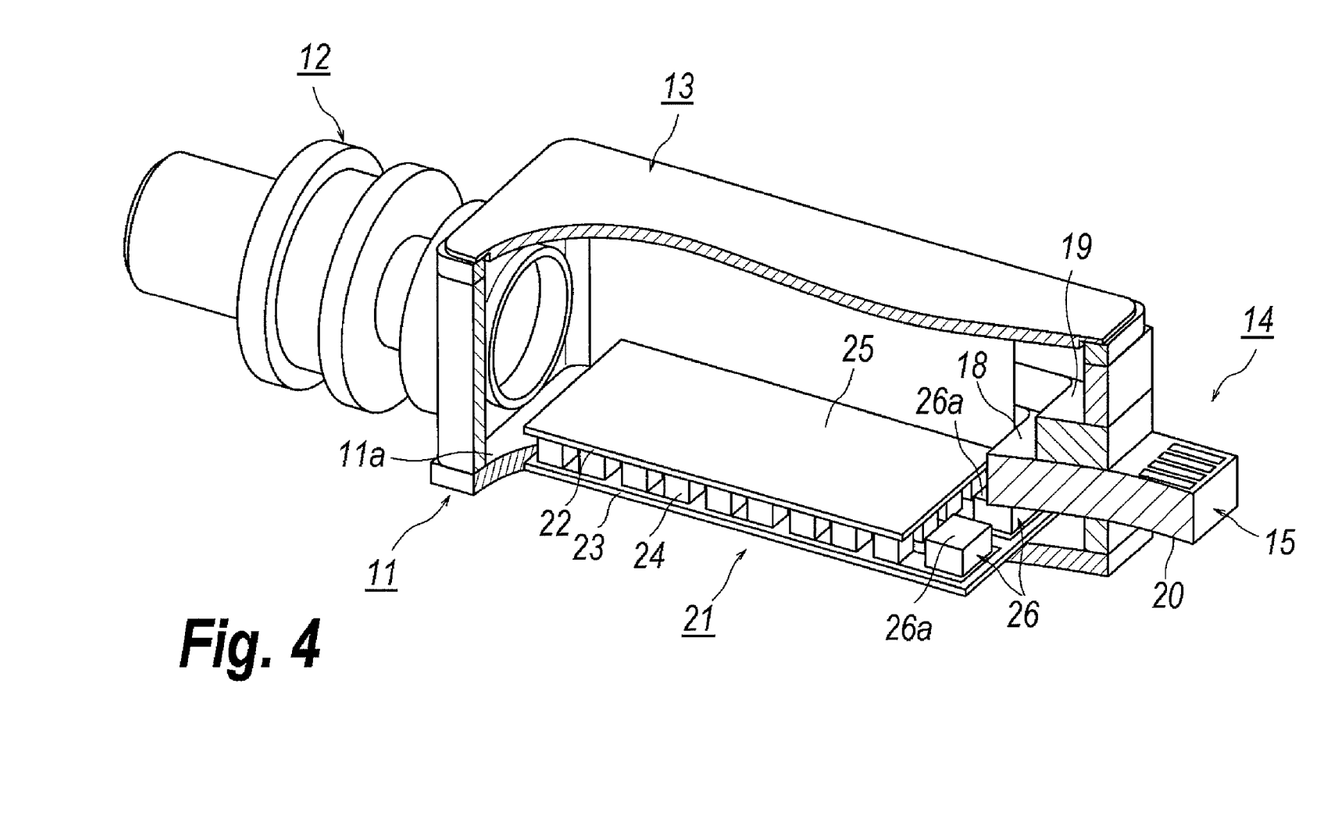
FIG. 4 shows a TEC and a ceramic layer on which electrical pads to be electrically connected to TEC is provided.
Figure 5:
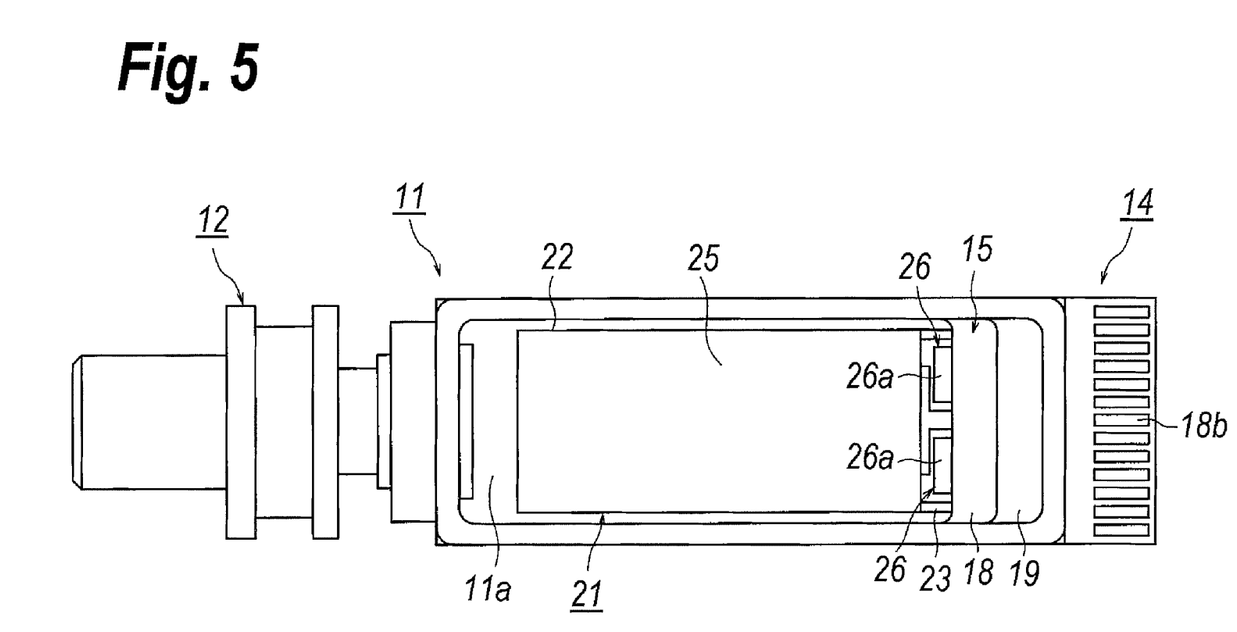
FIG. 5 is a plan view of the inside of the optical transmitter module to show a relation between the TEC and the ceramic layer.
Figure 6:
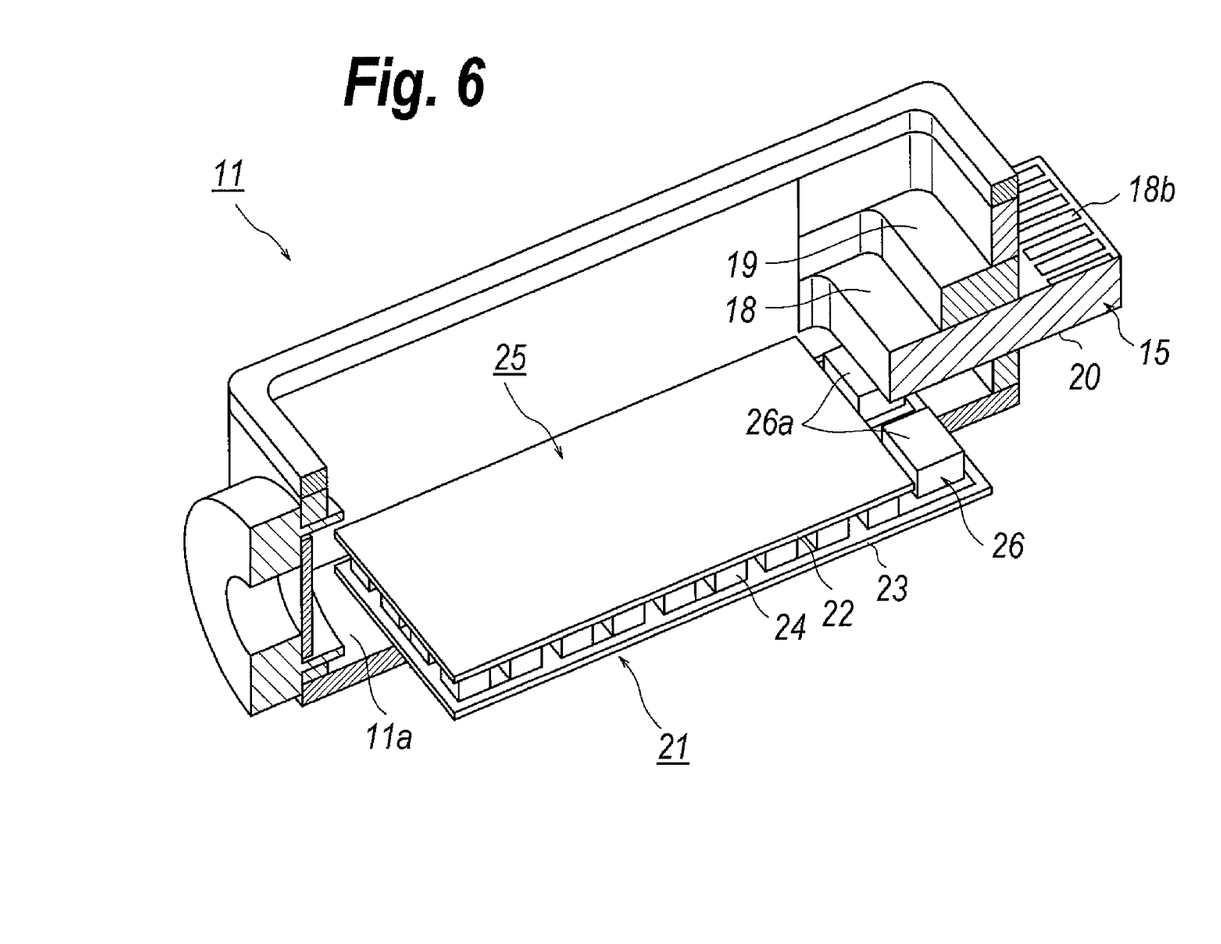
FIG. 6 shows a partial cross section of the TEC and the ceramic layer connected to the pillar on the TEC.

As described above, the TEC 21 installs electrical and optical devices thereon through the first and second carriers, 30 and 35. FIGS. 4 to 6 illustrate the TEC 21 in a state before such electrical and/or optical devices are mounted on the IBC 21, that is, a state where the top plate 22 of the TEC 21 is exposed.

The TEC 21 includes the top plate 22, the bottom plate 23, and a plurality of Peltier elements 24 between two plates, 22 and 23. The top surface 25 of the top plate 22 mounts such devices thereon, while, the bottom surface of the bottom plate 23 faces and is attached to the bottom 11a of the box portion 11. Installing the TEC 21 within the box portion 11, the top plate 22 in a rear end thereof extends close to the front edge of the first ceramic layer 15. Moreover, the level of the top surface 25 of the top plate 22 is designed to be placed on a level between the top 18 and the back surface 20 of the first ceramic layer 15.

The bottom plate 23 of the EC 21 in a length along the longitudinal direction of the box portion 11 is longer than a length of the top plate 22. That is, a portion of the bottom plate 23 is exposed from the top plate 21. Accordingly, the bottom plate 23 overlaps with the first ceramic layer 15, and rear edge of the bottom plate 23 is hidden by the first ceramic layer 15 such that a rear portion of the bottom plate 23 faces the back surface 20 of the first ceramic layer 15 and this rear portion exposed from the top plate 22 mounts thereon two pillars 26 in side by side arrangement. The pillar 26 has a rectangular shape in the present embodiment, but the pillar 26 may be a column. A feature of the present embodiment is that a top 26a of the pillars 26 is directly in contact with the back surface 20 of the first ceramic layer 15.

Figure 7:
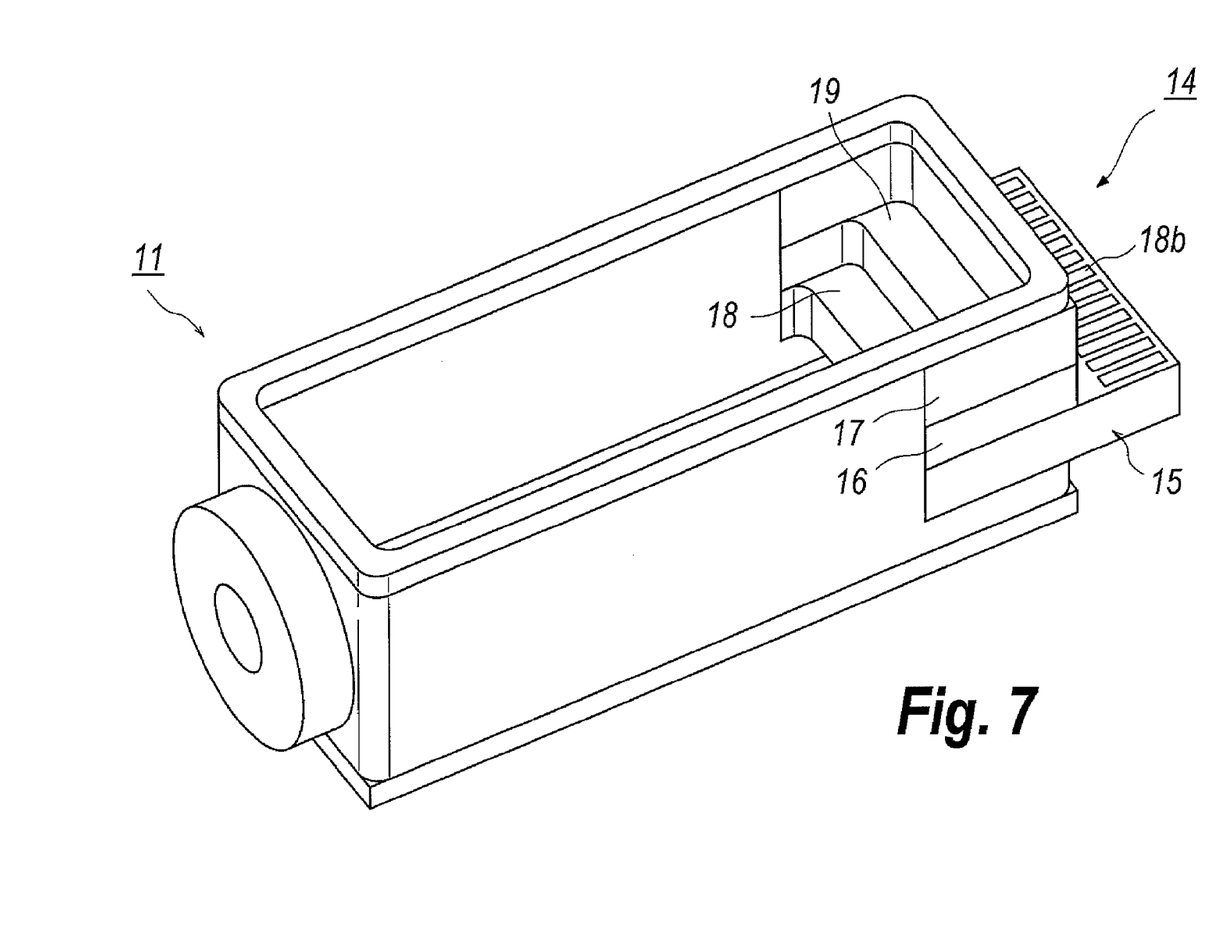
FIG. 7 shows an outer appearance of the box portion of the optical transmitter module shown in FIG. 1.
Figure 9:
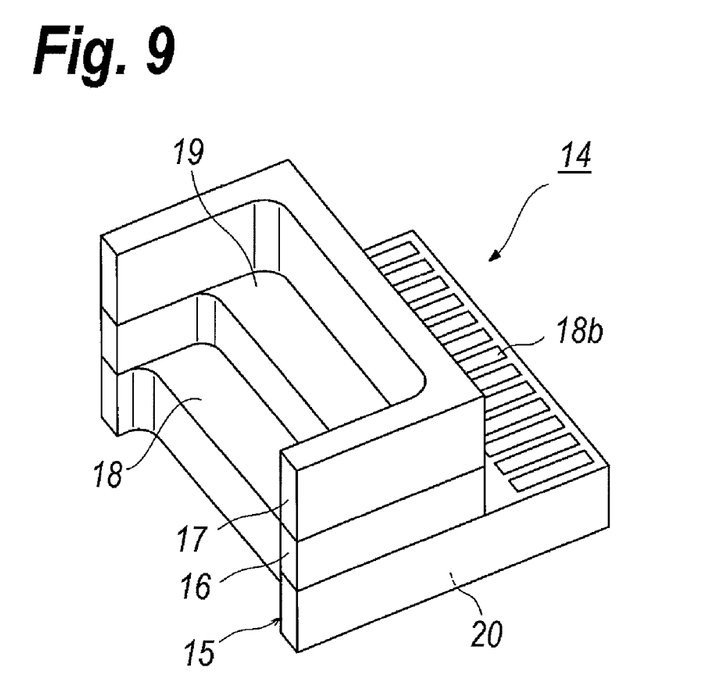
FIG. 9 magnifies a portion of the box portion connected to the pillar of the TEC.

FIGS. 7 to 9 magnify the electrical plug 14; in particular, FIG. 8 magnifies the back surface 20 of the first ceramic layer 15. As described, the electrical plug 14 comprises first to third ceramic layers, 15 to 17, and the first ceramic layer 15 overlaps with the pillar 26; but the electrical plug 14 may include four or more ceramic layers. The first ceramic layer 15 extrudes not only inside of the box portion 11 but the outside thereof. The wirings formed on the top surface 18 carry signals to modulate the LDs 32, namely, signals containing high frequency components, from the outside of the box portion 11 into the inside thereof.

The back surface 20 of the first ceramic layer 15, as illustrated in FIG. 8, provides two pads 20a arranged in side by side with a space 20c to isolate two pads 20a electrically. The pads 20a, coming in contact with the pillar 26, supplies the current to drive the TEC 21. The pads 20a have a rectangular shape in the present arrangement shown in FIG. 8. However, the pads 20a may have a circular shape corresponding to the columnar pillar 26.

When the pad 20a is electrically connected to the pad 18b formed on the top surface 18 of the first ceramic layer 15, a via hole piercing from the top surface 18 to the back surface 20 and filled with a metal is formed in the first ceramic layer 15. When the pad 20a is wired to the pad 20b formed in the back surface 20 of the first ceramic layer 15 outside of the box portion 11, the wiring is formed on the back surface 20 of the first ceramic layer 15. While, the pad 20a is overlapped with the top 26a of the pillar 26, or at least about half of the top 26a overlaps with the pad 20a; accordingly, the pad 20a is directly connected to the pillar 26 by, for instance, soldering. Thus, the TEC 21 is externally controlled through the electrical plug 14, the wiring on the first ceramic layer 15, and the pillar 26.

While, the level of the top 26a of the pillar 26 is lowered from the level of the top surface 25 of the top plate 22 of the TEC 21, where the pillar 26 does not interfere with the top plate 22; accordingly, the first carrier 30 in a rear end portion thereof may extrude from the rear edge of the top plate 22, as shown in FIG. 3. Moreover, the wiring substrate 34 also extrudes from the rear edge of the first carrier 30, which sets the wiring substrate 34 further close to the top surface 18 of the first ceramic layer 15 such that the top level of the wiring substrate 34 becomes substantially equal to the level of the top surface 18 of the first ceramic layer 15.

Thus, the distance between the top surface 18 of the first ceramic layer 15 and the wiring substrate 34 is able to be set shortest, which becomes preferable to carry high frequency signals. On the other hand, the pillar 26 directly comes in contact with the back pad 20a in the back surface 20 of the first ceramic layer 15, which becomes preferable to carry large current to the TEC 21. The current to drive the TEC 21 occasionally exceeds several amperes. When such a large current is supplied though a bonding wire, residual resistance inherently attributed to a bonding wire cause a large voltage drop.

As shown in FIG. 9, the second ceramic layer 16, which is put on the first ceramic layer 15, provides a top surface 19 exposed within the box portion 11, but the top surface 19 is drawn back so as to expose the top surface 18 of the first ceramic layer 15. The top surface 19 preferably provides interconnections and pads similar to the pads 18b on the top surface 18 of the first ceramic layer 15. The third ceramic layer 17, which is put on the second ceramic layer 16, has a shape of a frame to expose the top surface 19 of the second ceramic layer 16 within the box portion 11.

Figure 10:
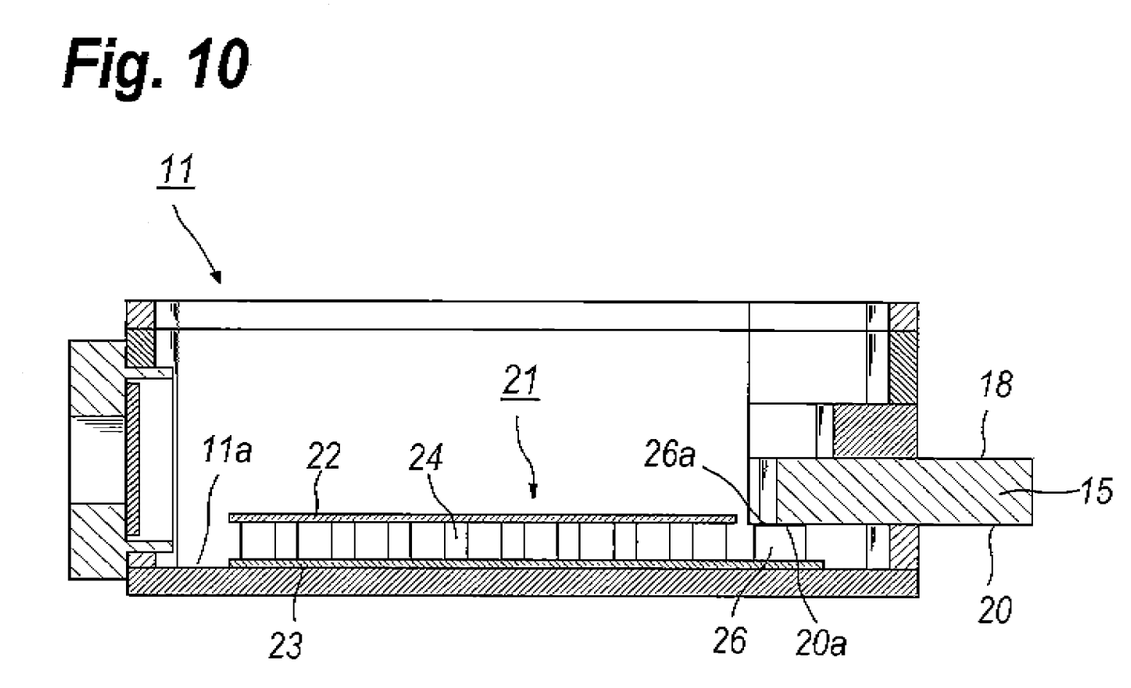
FIG. 10 shows a side cross section explaining a method to solder the TEC with the bottom of the box portion and the pillar with the pad on the ceramic layer.

Next, an arrangement to connect the TEC 21 with the first ceramic layer 15 and/or the wiring substrate 14 will be described. FIG. 10 shows a side cross section of the box portion 11 installing the TEC 21 therein. The pillar 26 is directly in contact with the pad 20a physically and electrically as overlapping with the first ceramic layer 15, or partially hidden by the first ceramic layer 15, by interposing a solder therebetween.

The solder preferably has a melting point lower than that of a solder to fix the TEC 21 to the bottom 11a of the box portion 11. For instance, the solder on the pillar 26 may be an alloy of gold tin (AuSn); tin, silver and copper (SnAgCu), tin and bismuth (SnBi), tin antimony (SnSb), and so on. Supplying a solder between the pillar and the pad 20a and heating the box portion 11, the solder melts and expands on the top 26a of the pillar 26 to connect the pillar 26 with the pad 20a electrically.

A preparation of a solder on the pillar 26 will be further described. Placing the TEC 21 on the bottom 11a of the box portion 11 as interposing solder pellets between the bottom plate 23 of the TEC 21 and the bottom 11a of the box portion 11; while, putting another solder pellets on the top 26a of the pillar 26, then, heating the box portion 11 with the TEC 21, the another solder pellets will melt and penetrate within a gap between the top 26a and the bottom 20 of the first ceramic layer 15 as forming a solder fillet on the top 26a of the pillar 26. Thus, the pillar 26 is electrically and physically connected to the pad 20a on the bottom 20 of the first ceramic layer 15.

It is preferable to carry out the heating under an atmosphere substituting an air into dry nitrogen (N) to reduce the oxygen (O) concentration. Lesser oxygen concentration may enhance the wettability of the solder, which secures the quality of the soldering. The air is preferably substituted by an atmosphere containing hydrogen (H) and/or formic acid, which may allow the restoration of oxygen to be enhanced and the wettability of the solder to be further enhanced. In particular, the atmosphere containing formic acid shows a lower restoring temperature; accordingly, even the solder is the type of SnAgCu with a low melting temperature is applied, the soldering without any fluxes may be realized.

The solder pellets enhances the soldering process because, by distributing the solder pellets in various positions within the box portion 11, those solder pellets may be melted at the same time. For instance, placing solder pellets under the bottom plate 23 of the TEC 21 and on the top 26a of the pillar, where each solder pellets are made of materials same to each other, and melting both solder pellets, the electrical connection from the pillar 26 to the pad 20a, and the physical fixation of the TEC 21 may be carried out at the same time.

Figure 11:
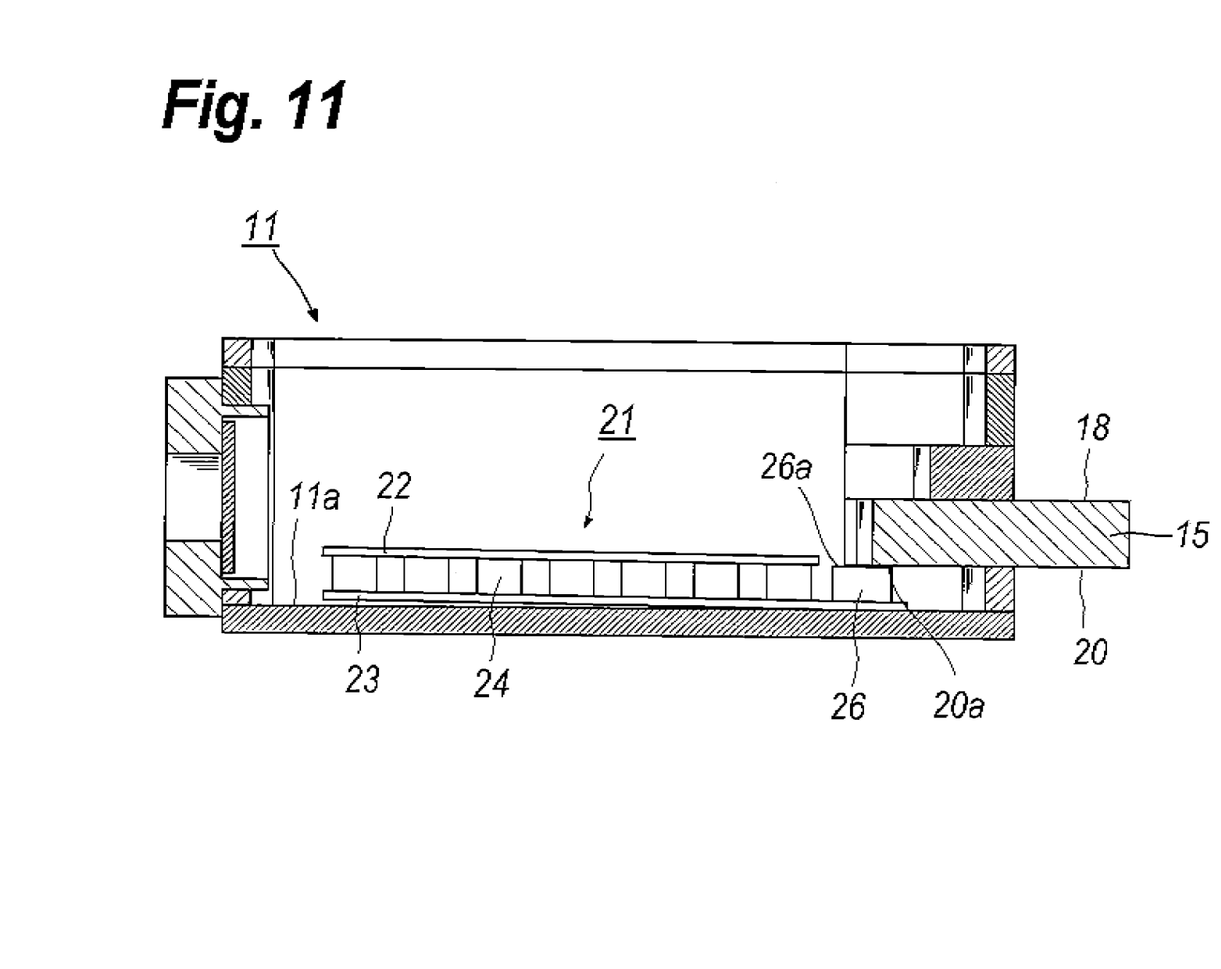
FIG. 11 shows a side cross section explaining another method to solder the TEC with the bottom of the box portion

One of alternates of the soldering described above is that, solder pellets are unnecessary to be placed under the whole of the bottom plate 23. Solder pellets placed in a restricted area under the bottom plate 23 is applicable to fix the TEC 21 to the bottom 11a of the box portion 11. As illustrated in FIG. 11, solder pellets are placed only in a side opposite to the pillar 26 and other solder pellets are supplied on the top 26a of the pillar 26 as already described; then, the TEC 21 in the side opposite to the pillar 26 is lifted up as inserting the pillar 26 under the bottom 20 of the first ceramic layer 15.

Heating the whole of the box portion 11, the melting solder on the bottom 11a of the box portion 11 penetrates between the bottom plate 23 and the bottom 11a toward the side of the pillar 26 and another melting solder on the pillar 26 also penetrates within a gap between the top 26a and the bottom 20, which slightly moves the TEC 21 toward the first ceramic layer 15 and levels the TEC 21. Then, not only the TEC 21 is fixed with the bottom 11a of the box portion 11 but the pillar 26 is electrically connected to the pad 20a.

The alternate soldering described above may widen the area on the top 26a of the pillar 26 connected to the pad 20a. When the pillar 26 is electrically connected to the pad 20a with bonding wires, and even when one of bonding wires is broken by, for instance, a bonding failure, rest wires are forced to flow a current exceeding the designed limit, which causes the degradation of the wires and shortens the lifetime thereof. The arrangement between the pillar 26 and the pad 20a according to the present embodiment realizes the electrical connection with a widened area and the shortest distance therebetween, which enhances the reliability of the connection.

Also, the arrangement between the pillar 26 and the pad 20a according to the present embodiment, as shown in FIG. 4, leaves a wide residual space within the box portion 11 for electrical and optical components, and makes it possible to extract and/or provide electrical signals from and/or to the box portion 11 only at the rear end thereof, which may narrow a width of the box portion 11. Recent optical transceiver, such as those following the standard of, for instance, CFP, CFP2, and/or CFP4, requires a narrower width of the housing. The optical transmitter module having the arrangement of the pillar 26 and the pad 20a of the present embodiments may be effectively installed within such an optical transceiver.

Although the explanation above concentrates on the solder or the solder pellets to connect the pillar 26 to the pad 20a; another material such as electrically conductive resin or paste may be used. Dripping the conductive paste on the top 26a of the pillar 26 and hardening the paste, the electrical connection between the pillar 26 and the pad 20a is realized.

Also, the description above concentrates on the process where the fixation of the TEC 21 on the bottom 11a and the electrical connection between the pillar 26 and the pad 20a are carried out at the same time, or the same heating process. However, two-step heating is applicable. Specifically, the fixation of the TEC 21 is performed by the first heating, then, solder pellets are placed on the top 26a of the pillar 26 and subsequent heating, the second heating, performs the electrical connection between the pillar 26 and the pad 20a.

In the foregoing detailed description, the method and apparatus of the present invention have been described with reference to specific exemplary embodiments thereof. It will, however, be evident that various modifications and changes may be made thereto without departing from the broader spirit and scope of the present invention. The present specification and figures are accordingly to be regarded as illustrative rather than restrictive.

What is claimed is:

1. A transmitter optical module, comprising:
an optical transmitting device to emit light;
a thermo-electric controller (TEC) to control a temperature of the optical transmitting device, the TEC providing a top plate, a bottom plate, and a plurality of Peltier elements put between the top plate and the bottom plate, the TEC including a pillar through which a current driving the Peltier elements is supplied, the bottom plate having an area wider than an area of the top plate; and
a box portion enclosing the optical transmitting device and the TEC therein, the box portion including a ceramic layer having an electrical pad facing the pillar of the TEC,
wherein the pillar of the TEC is provided in an area of the bottom plate not overlapping with the top plate and directly in contact with the electrical pad on the ceramic layer without using any bonding wires.

2. The transmitter optical module of claim 1,
wherein the ceramic layer includes a top surface and a back surface opposite to the top surface,
wherein the pad directly in contact with the pillar of the TEC is provided in the back surface of the ceramic layer.

3. The transmitter optical module of claim 2,
wherein the top surface of the ceramic layer provides an interconnection for carrying an electrical signal provided to the optical transmitting device.

4. The transmitter optical module of claim 1,
further including a plurality of the optical transmitting devices, each emitting light with a specific wavelength different from others,
wherein the optical transmitting devices are mounted on the TEC.

5. The transmitter optical module of claim 4,
further including a driver to drive each of the optical transmitting devices, the driver being mounted on the TEC.

6. The transmitter optical module of claim 5,
further including a wiring substrate,
wherein the ceramic layer provides a top surface and a back surface opposite to the top surface, the back surface providing the electrical pad and the top surface providing an interconnection electrically connected to the wiring substrate, and
wherein the driver is supplied with driving signals through the interconnection of the top surface of the ceramic layer and the wiring substrate.

7. The transmitter optical module of claim 6,
wherein the wiring substrate extrudes from an edge of the top plate of the TEC.

8. The transmitter optical module of claim 4,
further including an optical multiplexer configured to multiplex the plurality of the light each emitted from the optical transmitting devices into a single optical beam,
wherein the optical multiplexer is mounted on the TEC.

* * * * *